United States Patent
Chuang et al.

(10) Patent No.: US 9,054,670 B2
(45) Date of Patent: Jun. 9, 2015

(54) CROSS-COUPLED BANDPASS FILTER

(75) Inventors: Min-Han Chuang, Taichung (TW); Chia-Chu Lai, Taichung (TW); Bo-Shiang Fang, Taichung (TW); Ho-Chuan Lin, Taichung (TW); Li-Fang Lin, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 316 days.

(21) Appl. No.: 13/588,077

(22) Filed: Aug. 17, 2012

(65) Prior Publication Data
US 2013/0141187 A1    Jun. 6, 2013

(30) Foreign Application Priority Data
Dec. 2, 2011   (TW) .............................. 100144340 A

(51) Int. Cl.
*H03H 7/09* (2006.01)
*H03H 7/12* (2006.01)
*H03H 7/01* (2006.01)
*H01P 1/203* (2006.01)

(52) U.S. Cl.
CPC . *H03H 7/09* (2013.01); *H03H 7/12* (2013.01); *H03H 7/0161* (2013.01); *H01P 1/20327* (2013.01)

(58) Field of Classification Search
CPC ......... H03H 7/09; H03H 7/12; H03H 7/0161; H01P 1/20327
USPC .......................... 333/174–177, 204–205, 185
See application file for complete search history.

(56) References Cited

U.S. PATENT DOCUMENTS

| 7,642,783 B2 * | 1/2010 | Freytag .......................... 324/322 |
| 2009/0167455 A1 * | 7/2009 | Liu et al. ........................ 333/25 |

* cited by examiner

Primary Examiner — Benny Lee
Assistant Examiner — Rakesh Patel
(74) Attorney, Agent, or Firm — Mintz Levin Cohn Ferris Glovsky and Popeo, P.C.; Peter F. Corless; Steven M. Jensen

(57) ABSTRACT

A cross-coupled bandpass filter includes first, second and third resonators such that a positive mutual inductance is generated between the first and third resonators and mutual inductance generated between the first and second resonators and mutual inductance generated between the second and third resonators have the same polarity, thereby generating a transmission zero in a high frequency rejection band.

6 Claims, 4 Drawing Sheets

CROSS-COUPLED BANDPASS FILTER

CROSS-REFERENCES TO RELATED APPLICATIONS

This application claims under 35 U.S.C. §119(a) the benefit of Taiwanese Application No. 100144340, filed Dec. 2, 2011, the entire contents of which is incorporated herein by reference.

BACKGROUND OF THE INVENTION

1. Field of the Invention

The present invention relates to cross-coupled filters, and more particularly, to a cross-coupled bandpass filter for generating a transmission zero in a high frequency rejection band.

2. Description of Related Art

Current portable communication devices have high requirements on pass band selectivity. Trisection cross-coupled bandpass filters are usually used to achieve high selectivity. In general, a microstrip filter using magnetic cross-coupling can generate a transmission zero in a low frequency rejection band while a microstrip filter using electric cross-coupling can generate a transmission zero in high frequency rejection band.

FIG. 1A is a schematic view of a conventional bandpass filter using electric cross-coupling. Referring to FIG. 1A, the conventional bandpass filter has three microstrip open-loop resonators 12, 14, 16 formed on a dielectric substrate 11. FIG. 1B shows the frequency response of the bandpass filter of FIG. 1A. Therein, curve C1 shows that a transmission zero can be generated in a high frequency rejection band. However, during an integrated passive device (IPD) fabrication process, input and output signals are fed through capacitors. As such, the capacitors connected to an input port (open-loop resonator 14) and an output port (open-loop resonator 16), respectively, are too close to each other, thus easily causing short circuits.

FIG. 2A is a schematic view of a conventional bandpass filter using magnetic cross-coupling. Referring to FIG. 2A, the bandpass filter has three microstrip open-loop resonators 22, 24, 26 formed on a dielectric substrate 21. FIG. 2B shows the frequency response of the bandpass filter of FIG. 2A. Therein, curve C2 shows that a transmission zero can be generated in a low frequency rejection band. However, during an IPD fabrication process, it is difficult to use electric cross-coupling to generate a transmission zero in a high frequency rejection band.

FIG. 3A shows a magnetically cross-coupled bandpass filter 30 using an IPD fabrication process. Referring to FIG. 3A, the bandpass filter 30 has a resonator consisting of an inductor 32 and a capacitor 33a, a resonator consisting of an inductor 34 and a capacitor 35a and a resonator consisting of an inductor 36 and a capacitor 37a. The capacitor 35a serves as a signal input port, and the capacitor 37a serves as a signal output port. Two terminals of the inductor 32 constitute an opening 32a, and the two terminals are electrically connected together through the capacitor 33a and a capacitor lower plate 33b. Two terminals of the inductor 34 constitute an opening 34a, and the two terminals are electrically connected together through the capacitor 35a, a capacitor lower polar plate 35b and a through hole 35c. Similarly, two terminals of the inductor 36 constitute an opening 36a and the two terminals are electrically connected through the capacitor 37a, a capacitor lower polar plate 37b and a through hole 37c. FIG. 3B shows the frequency response of the bandpass filter 30. Curve C31 shows that a transmission zero is generated in a low frequency rejection band. Curve C32 shows that input reflection S11 and output reflection S22 are nearly the same in such a symmetrical configuration.

As described above, it is difficult to achieve electric cross-coupling in an IPD fabrication process so as to generate a transmission zero in a high frequency rejection band. Therefore, there is a need to provide a cross-coupled bandpass filter that is applicable in an IPD fabrication process so as to effectively use magnetic cross-coupling to generate a transmission zero in a high frequency rejection band.

SUMMARY OF THE INVENTION

In view of the above-described drawbacks, the present invention provides a cross-coupled bandpass filter, which comprises: a second resonator comprised of a second inductor, an interconnecting inductor and a second capacitor and having a second opening defined by two terminals of the second inductor, wherein the two terminals of the second inductor are electrically connected to each other through the interconnecting inductor, and the second capacitor is electrically connected to a middle portion of the second inductor and further electrically connected to the two terminals of the second inductor through the interconnecting inductor in a symmetrical manner; a first resonator comprised of a first inductor and a first capacitor and having a first opening defined by two terminals of the first inductor, wherein the two terminals of the first inductor are electrically connected to each other through the first capacitor; and a third resonator comprised of a third inductor and a third capacitor and having a third opening defined by two terminals of the third inductor, wherein the two terminals of the third inductor are electrically connected to each other through the third capacitor, wherein portions of the first and third resonators are symmetrically disposed inside the second opening of the second resonator.

In an embodiment, the first, second and third inductors and the interconnecting inductor are made of a magnetic semi-conductor or metal material.

In an embodiment, the first capacitor serves as a signal input port and the third capacitor serves as a signal output port. Further, the first and third openings are symmetrically disposed outside the second opening and spaced away from each other.

In an embodiment, a positive mutual inductance is generated between the first and third resonators, and mutual inductance generated between the first and second resonators and mutual inductance generated between the second and third resonators have the same polarity.

The present invention further provides a cross-coupled bandpass filter, which comprises: a first resonator having a first opening; a second resonator having a second opening; and a third resonator having a third opening, wherein portions of the first and third resonators are symmetrically disposed inside the second opening such that a positive mutual inductance is generated between the first and third resonators and mutual inductance generated between the first and second resonators and mutual inductance generated between the second and third resonators have the same polarity.

Compared with the prior art, the present invention can generate a transmission zero in a high frequency rejection band so as to overcome the conventional difficulty of generating a transmission zero in a high frequency rejection band using an integrated passive device (IPD) fabrication process and improve the selectivity of the bandpass filter and the process compatibility.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modification and variations can be made without departing from the spirit of the present invention. Further, terms such as "first", "second", "opening", "terminals" etc. are merely for illustrative purpose and should not be construed to limit the scope of the present invention.

The present invention provides a magnetically cross-coupled bandpass filter applicable in an IPD fabrication process for generating a transmission zero in a high frequency rejection band, thereby achieving a bandpass filter with high selectivity.

Figure 4A:
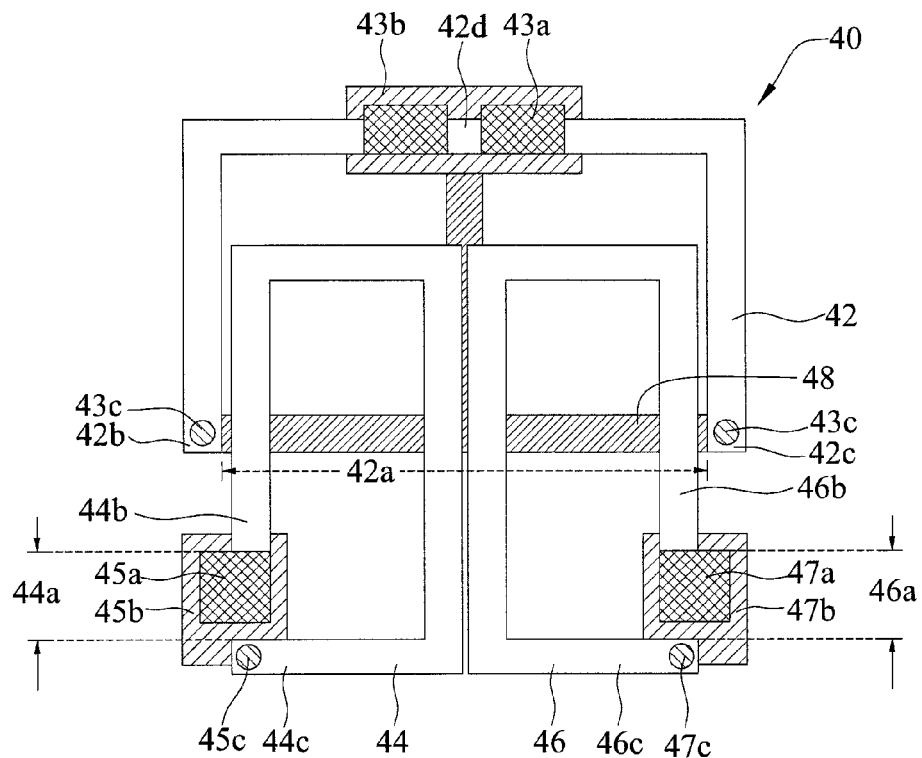
FIG. 4A is a schematic view of a magnetically cross-coupled bandpass filter according to an embodiment of the present invention.

FIG. 4A is a schematic view of a magnetically cross-coupled bandpass filter 40 according to an embodiment of the present invention. Referring to FIG. 4A, the magnetically cross-coupled bandpass filter 40 is a trisection magnetically cross-coupled structure consisting of first, second and third resonators. The second resonator consists of an inductor 42, an interconnecting inductor 48 and a capacitor 43a. The first resonator consists of an inductor 44 and a capacitor 45a. The third resonator consists of an inductor 46 and a capacitor 47a. The inductors 42, 44, 46 are made of such as a magnetic semiconductor or metal material.

The second resonator consists of the inductor 42, the interconnecting inductor 48 and the capacitor 43a, and has an opening 42a consisting of two terminals 42b, 42c of the inductor 42. The two terminals 42b, 42c of the inductor 42 are electrically connected to each other through the interconnecting inductor 48. The capacitor 43a is electrically connected to a middle portion 42d of the inductor 42 and further electrically connected to the two terminals 42b, 42c through the interconnecting inductor 48 in a symmetrical manner. For example, left and right portions of the inductor 42 are symmetrical about the middle portion 42d and electrically connected to a capacitor lower polar plate 43b through the capacitor 43a and further electrically connected to the two terminals 42b, 42c through the capacitor lower polar plate 43b and the interconnecting inductor 48, thereby forming a symmetrical resonator structure.

The first resonator consists of the inductor 44 and the capacitor 45a and has an opening 44a consisting of two terminals 44b, 44c of the inductor 44. The two terminals 44b, 44c of the inductor 44 are electrically connected to each other through the capacitor 45a. For example, the terminal 44b of the inductor 44 is electrically connected to a capacitor lower polar plate 45b through the capacitor 45a and further electrically connected to the terminal 44c through the capacitor lower polar plate 45b and a through hole 45c, thereby forming a resonator structure.

The third resonator consists of the inductor 46 and the capacitor 47a and has an opening 46a consisting of two terminals 46b, 46c of the inductor 46. The two terminals 46b, 46c of the inductor 46 are electrically connected to each other through the capacitor 47a. For example, the terminal 46b of the inductor 46 is electrically connected to a capacitor lower polar plate 47b through the capacitor 47a and further connected to the terminal 46c through the capacitor lower polar plate 47b and a through hole 47c, thereby forming a resonator structure.

Referring to the drawing, portions of the first and third resonators are disposed inside the opening 42a and symmetrical about the middle portion 42d of the inductor 42. The opening 44a of the first resonator and the opening 46a of the third resonator are symmetrically disposed outside the opening 42a and spaced away from each other. The capacitor 45a serves as a signal input port and the capacitor 47a serves as a signal output port. In the present embodiment, a positive mutual inductance is generated between the first and third resonators, and mutual inductance generated between the first and second resonators and mutual inductance generated between the second and third resonators have the same polarity. That is, the signal input port (first resonator) and the signal output port (third resonator) have a positive mutual inductance, and the polarities of mutual inductances between the signal input port and the second resonator and between the signal output port and the second resonator are the same. As such, the magnetically cross-coupled bandpass filter 40 can effectively generate a transmission zero in a high frequency rejection band so as to overcome the conventional drawback. In the present embodiment, all the inductors can be, but not limited to, induction coils.

Figure 1A:
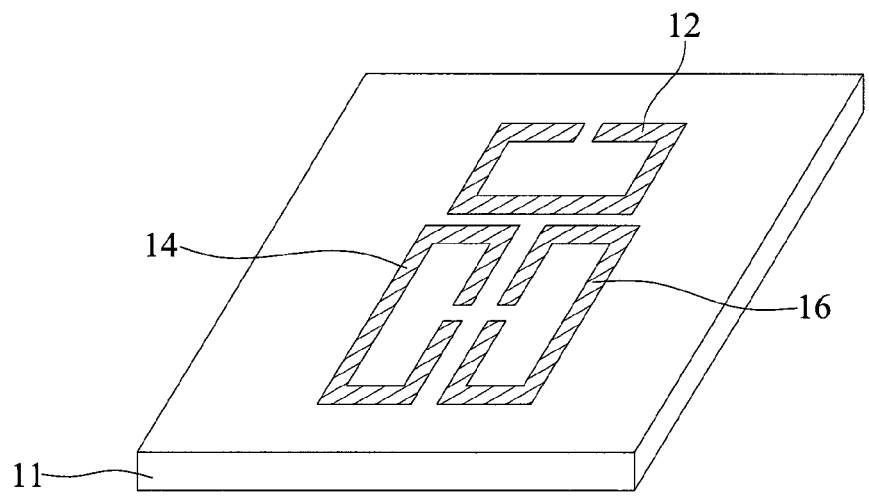
FIG. 1A is a schematic view of a conventional bandpass filter using electric cross-coupling.
Figure 1B:
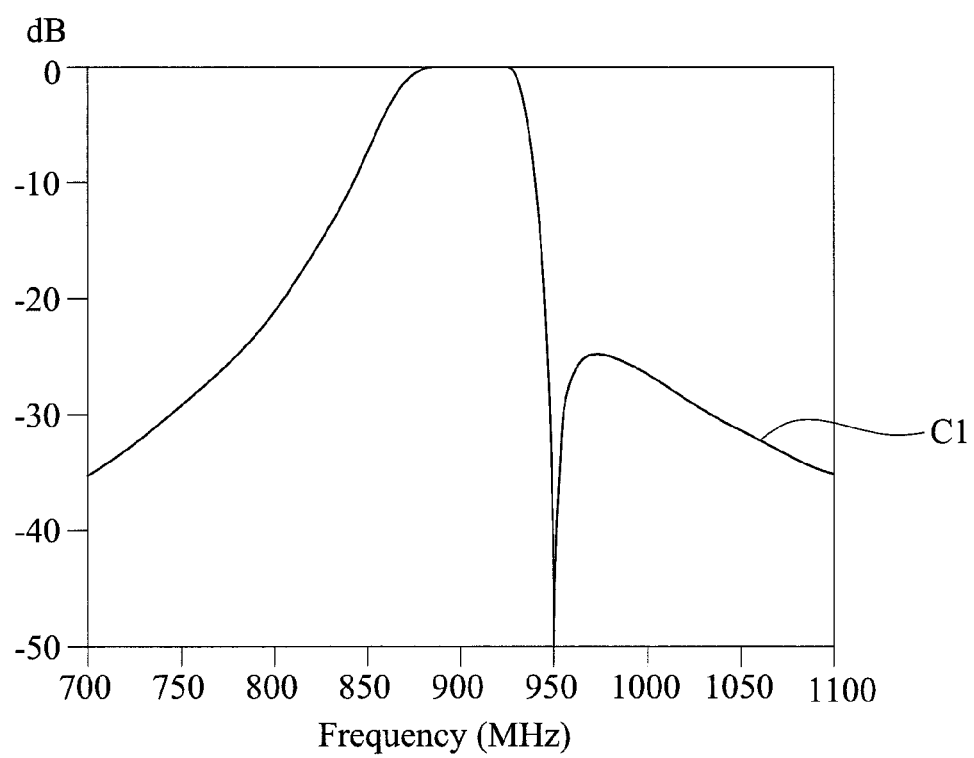
FIG. 1B is a graph showing the frequency response of the bandpass filter of FIG. 1A.
Figure 2A:
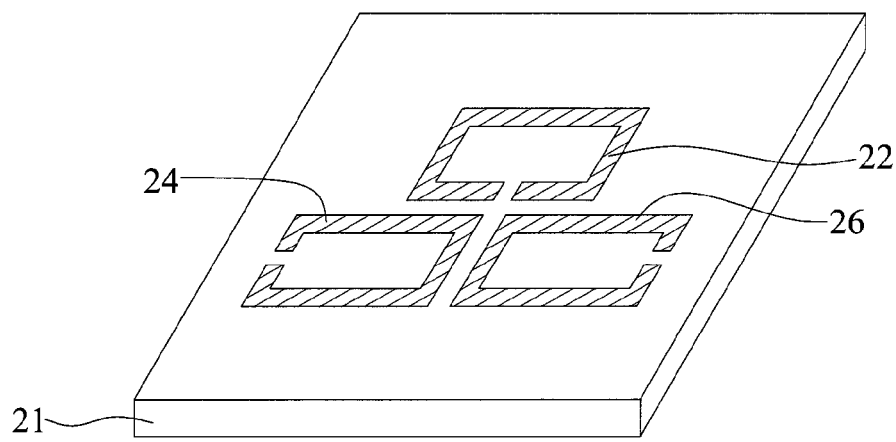
FIG. 2A is a schematic view of a conventional bandpass filter using magnetic cross-coupling.
Figure 2B:
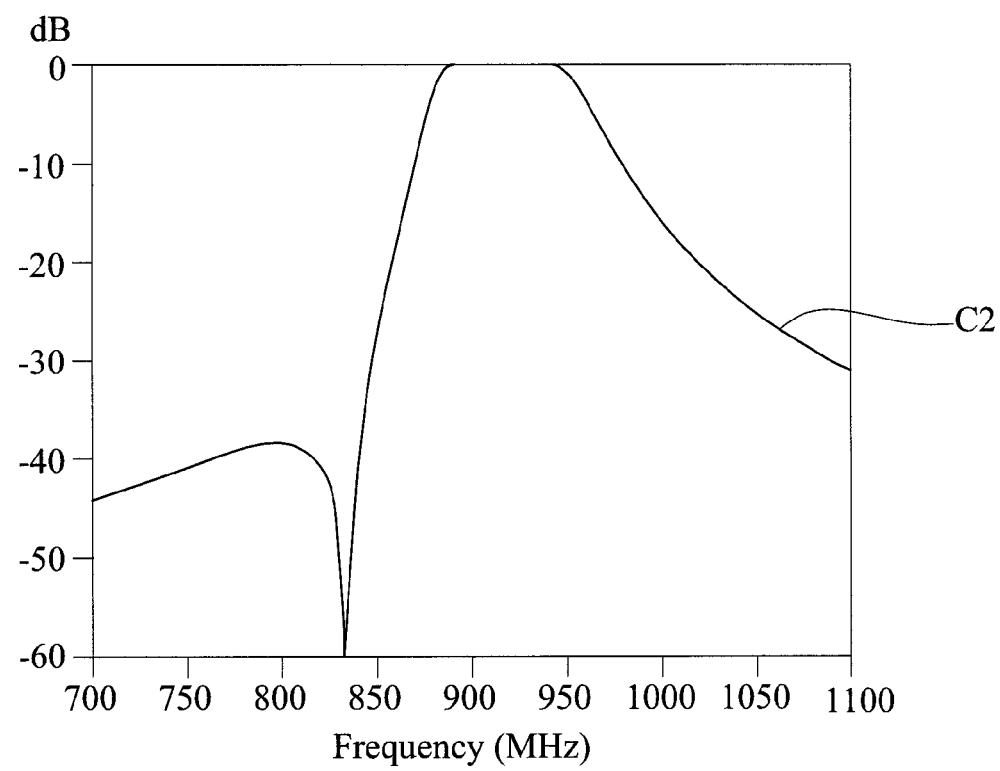
FIG. 2B is a graph showing the frequency response of the bandpass filter of FIG. 2A.
Figure 3A:
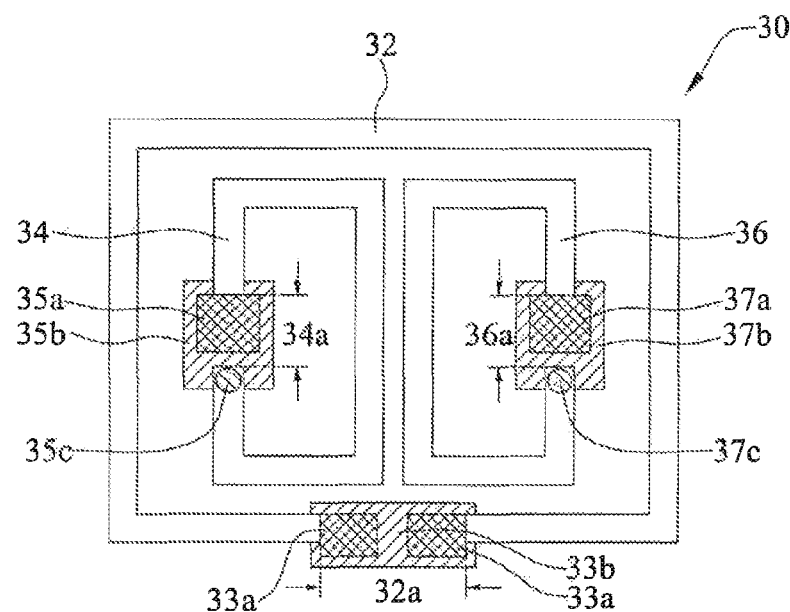
FIG. 3A is a schematic view of a magnetically cross-coupled bandpass filter using a conventional integrated passive device (IPD) fabrication process.
Figure 3B:
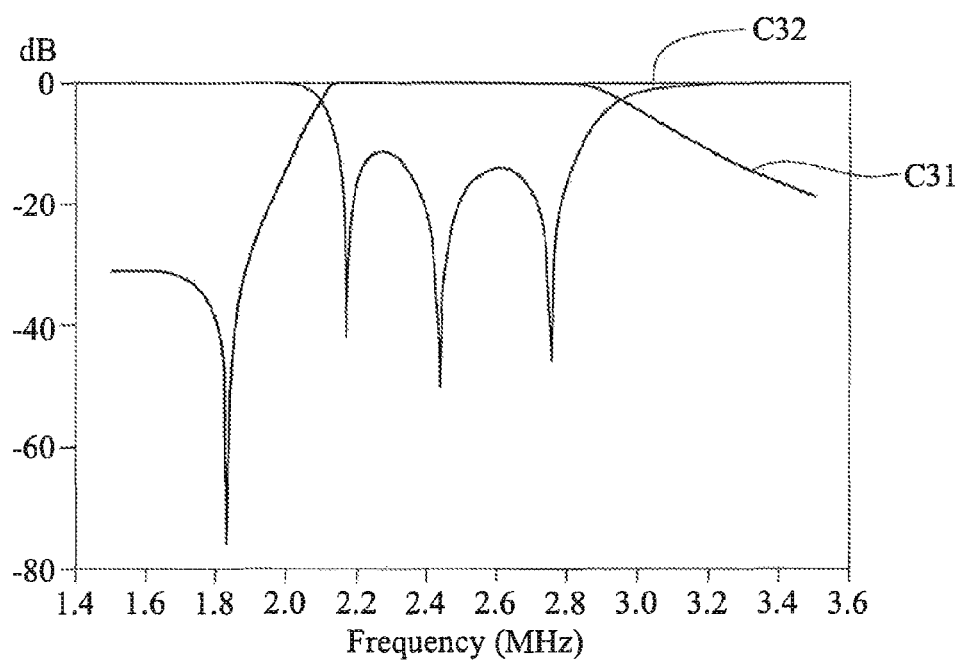
FIG. 3B is a graph showing the frequency response of the bandpass filter of FIG. 3A.
Figure 4B:
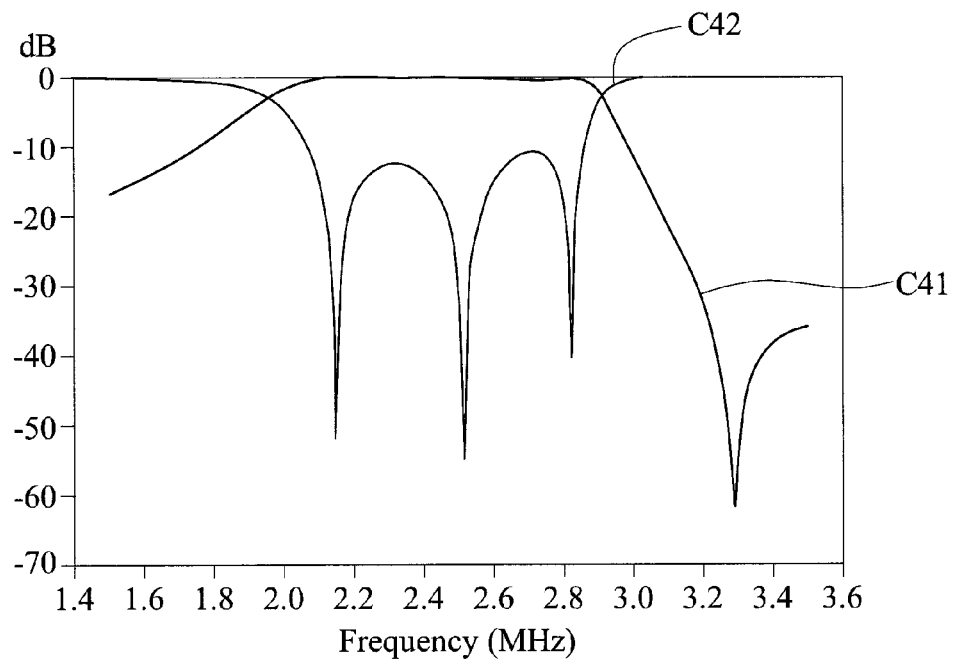
FIG. 4B is a graph showing the frequency response of the bandpass filter of FIG. 4A.

FIG. 4B shows the frequency response of the magnetically cross-coupled bandpass filter 40. Curve C41 shows that a transmission zero is generated in a high frequency rejection band. Curve C42 shows that input reflection (S11) and output reflection (S22) are nearly the same in such a symmetrical configuration. Referring to the drawing, the magnetically cross-coupled bandpass filter 40 generates a transmission zero of −61.529 dB at a high frequency rejection band of about 3.292 GHz. Compared with the frequency response of FIG. 1B (generating a transmission zero of about −45 dB), the present invention achieves a preferred transmission zero effect and overcomes the conventional difficulty of generating a transmission zero in a high frequency rejection band using an IPD fabrication process.

Therefore, the present invention provides a bandpass filter with high selectivity so as to meet requirements of portable communication devices. Compared with the prior art that utilizes electric cross-coupling to generate a transmission zero in a high frequency rejection band, the present invention utilizes magnetic cross-coupling to generate a transmission zero in a high frequency rejection band, thereby improving the selectivity of the bandpass filter and the process compatibility.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A cross-coupled bandpass filter, comprising:
   a second resonator comprised of a second inductor, an interconnecting inductor and a second capacitor, and having a second opening defined by a gap between two terminals of the second inductor, wherein the two terminals of the second inductor are electrically connected to each other through the interconnecting inductor, and the second capacitor is disposed on and electrically connected to a middle portion of the second inductor and further electrically connected to the two terminals of the second inductor through the interconnecting inductor in a symmetrical manner;
   a first resonator comprised of a first inductor and a first capacitor and having a first opening defined by two terminals of the first inductor, wherein the two terminals of the first inductor are electrically connected to each other through the first capacitor; and
   a third resonator comprised of a third inductor and a third capacitor and having a third opening defined by two terminals of the third inductor, wherein the two terminals of the third inductor are electrically connected to each other through the third capacitor,
   wherein portions of the first and third resonators are symmetrically disposed inside the second opening of the second resonator.

2. The filter of claim 1, wherein a positive mutual inductance is generated between the first and third resonators, and a first mutual inductance generated between the first and second resonators and a second mutual inductance generated between the second and third resonators respectively have the same polarity.

3. The filter of claim 2, wherein the first, second and third inductors and the interconnecting inductor are made of a magnetic semiconductor material.

4. The filter of claim 2, wherein the first, second and third inductors and the interconnecting inductor are made of a magnetic metal material.

5. The filter of claim 2, wherein the first capacitor serves as a signal input port and the third capacitor serves as a signal output port.

6. The filter of claim 5, wherein the first and third openings are symmetrically disposed outside the second opening and spaced away from each other.

* * * * *